(12) United States Patent
Mengel et al.

(10) Patent No.: US 7,796,274 B2
(45) Date of Patent: Sep. 14, 2010

(54) SYSTEM FOR MEASURING THE IMAGE QUALITY OF AN OPTICAL IMAGING SYSTEM

(75) Inventors: Markus Mengel, Heidenheim (DE); Ulrich Wegmann, Koenigsbronn (DE); Albrecht Ehrmann, Aalen (DE); Wolfgang Emer, Aalen (DE); Reiner Clement, Amstetten (DE); Ludo Mathussen, Schwaebisch Gmuend (DE)

(73) Assignee: Carl Zeiss SMT AG, Oberkochen (DE)

( * ) Notice: Subject to any disclaimer, the term of this patent is extended or adjusted under 35 U.S.C. 154(b) by 183 days.

(21) Appl. No.: 11/628,061
(22) PCT Filed: Jun. 2, 2005
(86) PCT No.: PCT/EP2005/005918
§ 371 (c)(1),
(2), (4) Date: Nov. 12, 2007
(87) PCT Pub. No.: WO2005/119368
PCT Pub. Date: Dec. 15, 2005

(65) Prior Publication Data
US 2008/0252876 A1 Oct. 16, 2008

Related U.S. Application Data

(60) Provisional application No. 60/576,803, filed on Jun. 4, 2004.

(51) Int. Cl.
*G01B 11/02* (2006.01)
(52) U.S. Cl. .................................... 356/515
(58) Field of Classification Search ............... 356/515, 356/521, 51
See application file for complete search history.

(56) References Cited

U.S. PATENT DOCUMENTS 5,769,954 A 6/1998 Wanner et al.

(Continued)

FOREIGN PATENT DOCUMENTS

DE 101 09 929 11/2001

(Continued)

OTHER PUBLICATIONS

Schroeder, Gottfried, "Technische Optik: Grundlagen und Anwendungen," 8th edition, Vogel Buchverlag, Wuerzburg, Germany, 1998, pp. 46-47.

(Continued)

*Primary Examiner*—Tarifur Chowdhury
*Assistant Examiner*—Jonathan M Hansen
(74) *Attorney, Agent, or Firm*—Fish & Richardson P.C.

(57) ABSTRACT

A measuring system (100) for the optical measurement of an optical imaging system (150), which is provided to image a pattern arranged in an object surface (155) of the imaging system in an image surface (156) of the imaging system, comprises an object-side structure carrier (110) having an object-side measuring structure (111), to be arranged on the object side of the imaging system; an image-side structure carrier (120) having an image-side measuring structure (121), to be arranged on the image side of the imaging system; the object-side measuring structure and the image-side measuring structure being matched to each other in such a way that, when the object-side measuring structure is imaged onto the image-side measuring structure with the aid of the imaging system, a superposition pattern is produced; and a detector (130) for the locally resolving acquisition of the superposition pattern. The imaging system is designed as an immersion system for imaging with the aid of an immersion liquid (171). A structure carrier to be arranged in the region of the immersion liquid is assigned a protective system (125) in order to increase the resistance of the measuring structure to degradation caused by the immersion liquid. A measurement of immersion systems under immersion conditions is thereby possible without detrimental influence of the immersion liquid on the measuring accuracy.

34 Claims, 5 Drawing Sheets

U.S. PATENT DOCUMENTS

| | | | |
|---|---|---|---|
| 5,973,773 | A | 10/1999 | Kobayashi |
| 6,307,635 | B1 * | 10/2001 | Goldberg .................... 356/521 |
| 6,381,013 | B1 * | 4/2002 | Richardson ................. 356/305 |
| 7,460,206 | B2 * | 12/2008 | Weissenrieder et al. ....... 355/30 |
| 2002/0001088 | A1 | 1/2002 | Wegmann et al. |
| 2002/0118370 | A1 * | 8/2002 | Nishida ..................... 356/515 |
| 2006/0181690 | A1 | 8/2006 | Nishinaga et al. |
| 2007/0064210 | A1 | 3/2007 | Kobayashi et al. |
| 2007/0115450 | A1 | 5/2007 | Nagasaka et al. |
| 2007/0273869 | A1 * | 11/2007 | Van Hout et al. ............ 356/124 |

FOREIGN PATENT DOCUMENTS

| | | |
|---|---|---|
| DE | 102 61 775 A1 | 7/2004 |
| EP | 0 418 054 A2 | 3/1991 |
| EP | 1 231 517 A1 | 8/2002 |
| EP | 1 416 327 A1 | 5/2004 |
| EP | 1 420 300 A2 | 5/2004 |
| JP | 2002 071513 A1 | 3/2002 |
| WO | WO 99/00689 A | 1/1999 |
| WO | WO 02/42728 A1 | 5/2002 |

OTHER PUBLICATIONS

M. Switkes and M. Rothshild, "Immersion Lithography at 157 nm", J.Vac.Sci. Technol. B 19(6), Nov./Dec. 2001.

D. Lammers, Internet publication under the title, "Doped Water Could Extend 193-nm Immersion Litho", Jan. 2004, http:/www.eetimes.com/semi/news/jan.2004.

Karl-Stefan Weissenrieder, U.S. Appl. No. 60/530,623, filed Dec. 19, 2003, entitled "Projection objective for immersion-lithography."

*Shafer et al.* v. *Omura*, "Shafer Motions List," for Patent Interference No. 105,678 (SCM), filed Mar. 25, 2009 with the United States Patent and Trademark Office before the Board of Patent Appeals and Interferences (13 pages).

*Shafer et al.* v. *Omura*, "Judgment—Request for Adverse—Bd.R. 127(b)," for Patent Interference No. 105,678 (SCM), filed Aug. 31, 2009 with the United States Patent and Trademark Office before the Board of Patent Appeals and Interferences (3 pages).

* cited by examiner

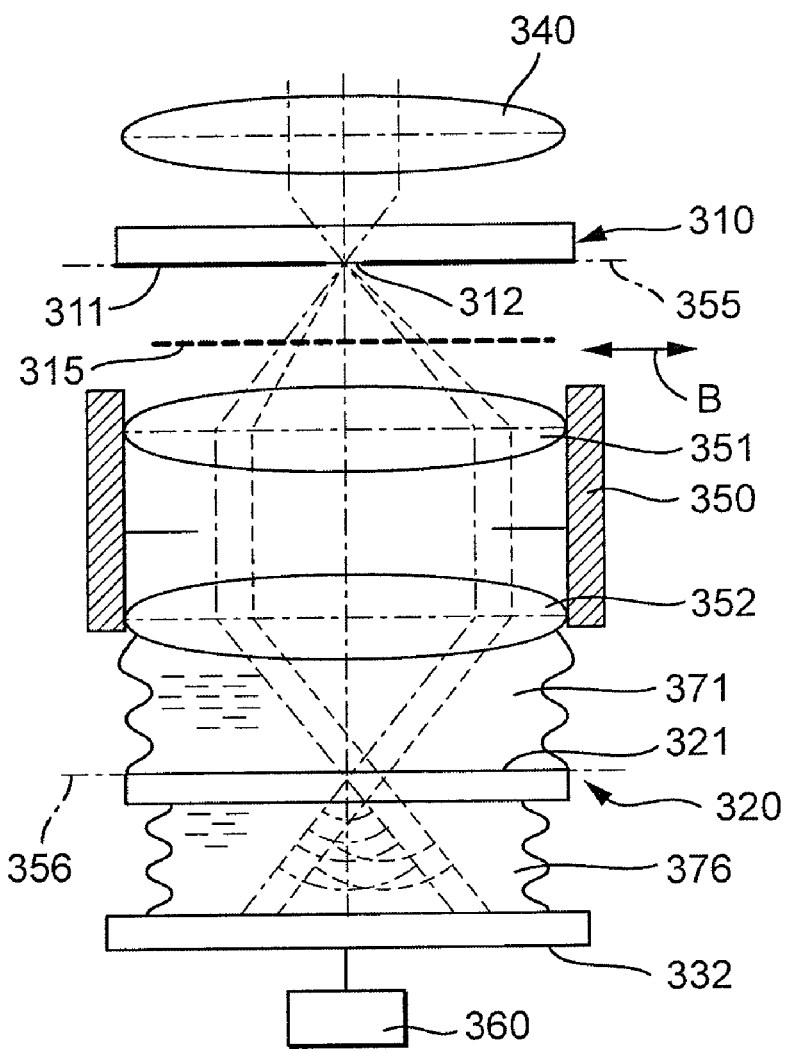
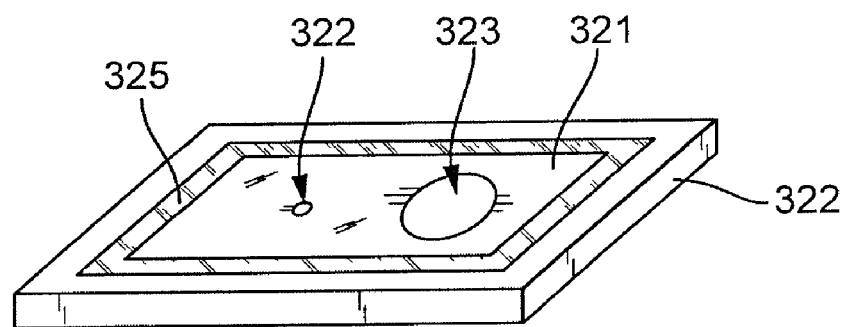
Fig.3
Fig.4

SYSTEM FOR MEASURING THE IMAGE QUALITY OF AN OPTICAL IMAGING SYSTEM

This application claims the benefit of U.S. Provisional Application 60/576,803 filed on Jun. 4, 2004. The complete disclosure of that provisional application is incorporated into this application by reference.

BACKGROUND OF THE INVENTION

1. Field of the Invention

The invention relates to a measuring system for the optical measurement of an optical imaging system which is provided to image a pattern arranged in an object surface of the imaging system into an image surface of the imaging system, the imaging system being designed as an immersion system for imaging with the aid of an immersion liquid arranged on at least one of the object-side and the image-side of the imaging system

2. Description of the Related Prior Art

In many areas in technology and research, optical imaging systems are used, on which increasingly high requirements are placed with respect to their imaging quality. One example is the photolithographic production of semiconductor components and other finely structured components, in which, with the aid of high power projection objectives, at operating wavelengths in the deep ultraviolet range (DUV), structures in the submicrometre range can be produced. Because of the complicated optical structure of such imaging systems with a large number of optical components, it is necessary, both for the adjustment of the original production and also during any necessary maintenance work, to measure the imaging systems with regard to image defects which occur. The accuracy of the measuring systems and methods used for the testing is in this case normally matched to the requirements on the imaging accuracy of the imaging systems.

Use is frequently made of measuring systems which comprise an object-side structure carrier having an object-side measuring structure, to be arranged on the object side of the imaging system, and an image-side structure carrier having an image-side measuring structure, to be arranged on the image side of the imaging system, the object-side measuring structure and the image-side measuring structure being matched to each other in such a way that, when the object-side measuring structure is imaged onto the image-side measuring structure with the aid of the imaging system, a superposition pattern is produced. A detector for the locally resolving acquisition of the superposition pattern and an evaluation device connected thereto for determining at least one imaging parameter describing the imaging quality of the imaging system from the superposition pattern are used to produce measured values which permit conclusions to be drawn about the imaging quality that can be achieved with the imaging system and from which predefinitions for an optimization of the imaging system can be derived.

An apparatus operating in the manner of a shearing interferometer for wave front acquisition is described in German patent application DE 101 09 929 (corresponding to patent application US 2002/0001088 A1 from the applicant). In this measuring system, an object-side structure carrier to be illuminated with incoherent light is arranged in the object surface of the imaging system to be tested and has the task of setting a predefined level of coherence of the measuring radiation passing through the imaging system and is therefore also designated a coherence mask. The coherence mask provided can be, for example, a transparent carrier fabricated from quartz glass, on which the object-side measuring structure is applied in the form of a two-dimensionally structured coating with chromium. Arranged in the image surface of the imaging system is an image-side structure carrier having an image-side measuring structure acting as a diffraction grating. This can likewise be formed by a chromium layer, which is applied to a transparent quartz glass carrier. As a result of the superposition of the waves produced by diffraction, a superposition pattern in the form of an interferogram (shearogram) is produced, which is acquired with the aid of the locally resolving detector connected downstream and is then evaluated. Similar measuring systems are disclosed by EP 1 231 517 A1.

The meaningfulness of the measuring method is particularly high if, for this wave front measurement, use is made of the same radiation which is also used in the intended use of the imaging system, for example ultraviolet light from the DUV range. For this purpose, the measuring system can be integrated into a microlithographic projection exposure system, so that, for the measurement of a projection objective, the same illumination system which is also used during production operation can be used. In the case of external measurement, independent measuring systems with illumination systems which are of the same type or of a similar type can be used.

Other interferometers can likewise be used, for example interferometers of the Ronchi type or Twyman-Green type. Furthermore, point diffraction interferometers (PDI) are also common as measuring systems. Examples are shown in the documents U.S. Pat. No. 6,307,635 B1 or WO 02/42728 A1. An object-side measuring structure to be arranged on the object side of the imaging system has a pinhole, which is arranged on an object-side structure carrier and is used to generate a spherical wave from the illuminating radiation. On the image side of the imaging system there is arranged a further pinhole structure in which, in addition to a pinhole, a second, larger opening is provided to allow a specimen wave to pass through freely. As a further measuring structure which, in particular, is arranged between object surface and imaging objective or between imaging objective and image surface, a diffraction grating serving as a beam splitter is provided. The fine structures of the pinhole masks and of the diffraction grating can be formed by microstructured coatings on transparent carriers.

Other measuring systems and methods, in particular for measuring the distortion of optical imaging systems, are based on using the Moiré effect. In this case, an object grating is arranged in the object surface of the imaging system to be tested and, for example, comprises a large number of parallel, non-transparent lines which form the object-side measuring structure. In the image plane there is arranged an image-side measuring structure which is similar to the object-side measuring structure, the object-side measuring structure and the image-side measuring structure being matched to each other, while taking account of the imaging scale of the imaging system, such that when the object-side measuring structure is imaged onto the image-side measuring structure, a superposition pattern in the form of a Moiré pattern with Moiré fringes is produced. From the intensity distribution of the fringe pattern, which is acquired with a locally resolving detector, imaging parameters can be determined, for example for the distortion. Moiré methods are known, for example, from the patents U.S. Pat. No. 5,769,954, U.S. Pat. No. 5,973,773 or EP 0 418 054.

Furthermore, it may be necessary, in addition to the above-mentioned measuring structures but also independently of the latter, to fit a diaphragm structure in the image plane, which is used for the purpose of keeping undesired contributions of the image field away from detection elements of the measuring system, in order to minimize the error contribution from stray light. This diaphragm structure is preferably likewise formed by a transparent substrate coated with structured chromium.

In the case of projection objectives for microlithography, attempts are made to increase the resolving power by various measures to such an extent that finer and finer structures, for example of the order of magnitude of 100 nm or less, can be produced. For this purpose, firstly the image-side numerical apertures (NA) of the projection objectives are increased to values in the region of NA=0.8 or above. Secondly, shorter and shorter wavelengths of ultraviolet light are used, for example the laser wavelengths 193 nm or 157 nm.

There are approaches to improving the achievable resolution by an immersion liquid with a high refractive index being introduced into the space between the last image-side optical element of the projection objective and the substrate to be exposed. This technique is designated immersion lithography; the projection objectives suitable for this purpose are designated immersion objectives. The theoretical advantages of immersion lithography lie in the possible increase in the numerical aperture to values NA>1 and thus a possible increase in the resolving power or an improved depth of focus. This can be achieved with an unchanged vacuum wavelength, so that techniques of light generation, of the selection of optical materials, of coating technology, etc., established for the corresponding wavelength, can be transferred largely unchanged. The use of immersion media is in addition a precondition for the use of projection objectives having extremely high numerical apertures in the region of NA=1 or above.

For 193 nm, extremely pure water with a refractive index $n_I$=1.437 stands out as a suitable immersion liquid. For 157 nm, at present immersion liquids based on perfluoropolyethers (PFPE) are favored. One immersion liquid tested has a refractive index $n_I$=1.37 at 157 nm (see the article "Immersion Lithography at 157 nm", by M. Switkes and M. Rothschild, J. Vac. Sci. Technol. B 19(6), November/December 2001, pages 1 ff.)

Since, for meaningful measured results, it is advantageous to carry out the measurement of the imaging system under conditions which are similar to the conditions during the intended use or are identical to these, attempts have already been made to adapt the measurement techniques established for dry systems to the measurement of immersion objectives. In the patent application DE 102 61 775.9 from the applicant, which has not yet been published, measuring systems are presented which are adapted for the measurement of immersion systems in that means forming fluid chambers are provided, in order for example to delimit an interspace between an object-side structure carrier and the imaging system and/or the interspace between an image-side structure carrier and the imaging system in such a way that an immersion liquid chamber is produced in which the immersion liquid can be held, at least for the period of the measurement. The disclosure content of this patent application is incorporated by reference in the present description.

According to observations by the inventors, during measurements under immersion conditions, it is possible for a gradual worsening of the measuring accuracy to occur.

SUMMARY OF THE INVENTION

The invention is based on the object of providing a measuring system of the type mentioned at the beginning which is suitable for measuring immersion imaging systems and which avoids impairment of the measuring accuracy by the immersion liquid.

As a solution to this object, the invention, according to one formulation, provides a measuring system for the optical measurement of an optical imaging system which is provided to image a pattern arranged in an object surface of the imaging system in an image surface of the imaging system, the imaging system being designed as an immersion system for imaging with the aid of an immersion liquid arranged on at least one of the object-side and the image-side of the imaging system. The measuring system includes at least one structure carrier having a measuring structure, the structure carrier being provided to be arranged in the region of the immersion liquid, the structure carrier being assigned a protective system in order to increase the resistance of the measuring structure to degradation caused by the immersion liquid.

Preferably, the measuring system includes an object-side structure carrier having an object-side measuring structure, to be arranged on the object side of the imaging system; an image-side structure carrier having an image-side measuring structure, to be arranged on the image side of the imaging system; the object-side measuring structure and the image-side measuring structure being matched to each other in such a way that, when the object-side measuring structure is imaged onto the image-side measuring structure with the aid of the imaging system, a superposition pattern is produced; and a detector for the locally resolving acquisition of the super-position pattern; wherein at least one of the object-side structure carrier and the image-side structure carrier is provided to be arranged in the region of the immersion liquid and is assigned a protective system in order to increase the resistance of the measuring structure to degradation caused by the immersion liquid.

As mentioned at the beginning, during the adjustment, qualification and characterization of optical imaging systems, it may be necessary to measure the imaging system in the operating mode envisaged with the aid of a measuring technique which assumes the use of an image-side measuring structure in the region of the image surface of the imaging system. The measuring techniques can be, for example, a Moiré measuring technique, a point diffraction measuring technique or the shearing interferometry mentioned.

If the imaging system to be qualified is an immersion system, during which an immersion liquid is provided between the last image-side optical element and the image surface during useful operation, in order to achieve meaningful measured results, it is expedient to partly or completely fill the interspace between the last optical element of the imaging system and the image-side measuring structure used for the measurement with the immersion liquid used during operation or an optically similar immersion liquid.

In many known measuring systems, the image-side measuring structures are formed by structured thin layers, which are applied to a substrate, generally transparent. A structure carrier can be formed, for example, by a substrate of quartz glass or fluoride crystal material, in which a metal layer which is structured in order to form the desired measuring structure, for example by etching, is applied to a substrate surface. A typical example is chromium layers on glass substrates. Problems can arise from the fact that the metallic structures are exposed directly to the immersion liquid and at the same time to the short-wave measuring radiation during immersion operation. In trials, under these conditions, gradual degradation of a chromium layer was able to be determined, which leads to a gradual change in the measuring structure affected and therefore also to the optical effect achieved by the latter.

In this way, the accuracy of the measurement can be impaired in a manner which is difficult to monitor.

These problems can be avoided if the measuring structure threatened by degradation is protected against the chemical and physical attack by the immersion medium by a suitable protective system. The protective system should be designed and arranged in such a way that the measuring structure of the structure carrier threatened by degradation is shielded by the protective system without uncontrollable impairment of the optical conditions with respect to the immersion liquid. As a result, long-term stability of the threatened measuring structure can be created for the measuring conditions under immersion, so that highly accurate measurements are possible under operating conditions close to those used in practice.

The structure carrier often comprises a substrate which is preferably transparent to the measuring radiation, a coating forming the measuring structure being applied to at least one substrate surface of the substrate. The coating can be structured two-dimensionally, for example by a microlithographic method or a direct structuring method, such that there are substantially opaque (radiation-impenetrable) regions beside largely transparent regions. In particular for applications in the ultraviolet region, thin coatings of metals or metal alloys, which can be structured easily, have proven worthwhile; in particular chromium or metals containing chromium can be beneficial.

The protective system can be arranged on the side of the coating facing away from the substrate and, in some embodiments, also covers uncoated regions of the substrate, in other embodiments substantially covering only the coating itself. The protective system is preferably applied in relation to the coating forming the structure and the substrate in such a way that the coating forming the structure is enclosed between the substrate and protective system in a manner which is substantially liquid-tight on all sides. In this way, encapsulation of the coating material threatened by degradation can be provided, which ensures long-term stability of the structure carrier under immersion measuring conditions.

In one development, the protective system comprises at least one protective layer that is transparent to the measuring radiation. In particular, the protective system can be formed exclusively by the protective layer. A protective layer can be produced in a suitable thin layer process (for example CVD, PVD or related coating process) and deposited directly on the measuring structure to be protected. In another development, an electroplated coating of a metallic coating forming the measuring structure is provided with a metal which is chemically more stable with respect to the immersion liquid than the material of the coating. It is also possible to form a protective layer from a reaction product of the material of a metallic coating forming the measuring structure, in order to produce a firmly adhering protective layer in the manner of a passivation layer.

A protective layer can be formed by a single material layer. It can be, for example, a substantially plane-parallel plate made of a transparent solid material or a thin individual layer produced in a thin layer process. A protective layer can also comprise a plurality of material layers lying one above another and, for example, can be formed as a dielectric alternating layer system or as a coated plate.

In one development, the protective layer comprises at least one barrier layer that is substantially impermeable to the immersion liquid. The barrier layer can consist of at least one barrier layer material that is substantially chemically resistant to the immersion liquid and is substantially free from pores which go through from an outer side of the barrier layer, facing away from the substrate, to the side of the barrier layer facing the structure. With the aid of a barrier layer, it is possible to prevent immersion liquid penetrating forwards as far as the protected measuring structure to any substantial extent. The barrier layer can be provided on its own or in combination with further material layers. A barrier layer can be formed as an individual layer or as a multiple layer.

In one development, the barrier layer consists substantially of an oxidic material with a high packing density. Particularly beneficial is the use of silicon dioxide ($SiO_2$), since this material can be used down to 193 nm as an absorption-free, low refractive index material in interference layer systems and, given suitable coating technology, for example ion sputtering, can be applied largely without pores.

In one embodiment, the protective layer provided is a single layer of silicon dioxide. Geometric layer thicknesses of a few tens of nanometres, for example between about 30 nm and about 100 nm, are currently viewed as suitable.

The protective layer can be designed in such a way that, in addition to the protective action against chemical-physical attack by the immersion liquid, which is of primary importance here, there is also a definable optical action, for example a reflection-reducing action for the solid-liquid interface between protective layer and immersion liquid.

The protective layer can contain at least one barrier layer having at least one fluoride material, which is substantially transparent to the corresponding operating wavelength and is substantially insoluble in the immersion medium. In particular, depending on the operating wavelength, the barrier layer can contain at least one of the following materials or consist substantially of such a material: actinium fluoride ($AcF_3$), bismuth fluoride ($BiF_3$), erbium fluoride ($ErF_3$), europium fluoride ($EuF_3$), gadolinium fluoride ($GdF_3$), holmium fluoride ($HoF_3$), potassium magnesium fluoride ($KMgF_3$), lanthanum fluoride ($LaF_3$), sodium yttrium fluoride ($NaYF_4$), neodymium fluoride ($NdF_3$), samarium fluoride ($SmF_3$), terbium fluoride ($TbF_3$), titanium fluoride ($TiF_3$), thulium fluoride ($TmF_3$), vanadium fluoride ($VF_3$), ytterbium fluoride ($YbF_3$), yttrium fluoride ($YF_3$). All the materials mentioned are suitable down to 193 nm. In particular, the rare earth fluorides $ErF_3$, $GdF_3$, $LaF_3$ and $KMgF_3$ can also be used at 157 nm.

It is also possible for the protective layer to comprise at least one barrier layer which contains at least one of the following oxide materials or substantially consists of one of these materials: silicon dioxide ($SiO_2$), magnesium aluminum oxide ($MgAl_2O_4$), aluminum oxide ($Al_2O_3$), tungsten dioxide ($WO_2$), tungsten trioxide ($WO_3$). Here all materials are suitable at 193 nm; $SiO_2$ can also be used at 157 nm, if small layer thicknesses are selected.

It is also possible for the protective system to be a separate component, which is fitted between the measuring structure to be protected and the immersion liquid, if necessary at a distance from the measuring structure. An interspace which may be present can, for example, be filled with a liquid which is less aggressive as compared with the immersion liquid or filled with gas. The protective system can comprise a transparent plane-parallel plate which, during the measurement, is arranged to lie directly on the measuring structure or is arranged at a distance from the latter, between the latter and the immersion liquid. A holding structure for the plate, for example an annular holding structure, can, when it is put in place, laterally enclose the measuring structure to be protected, so that the measuring structure is enclosed in a liquid-tight manner by the protective system formed by the plate and the holding structure.

In conventional measuring systems for dry systems, optical coating of the measuring structures is generally omitted, since a coating changes the optical properties of the bundle of light to be tested. In order to minimize impairment of the measured results by the protective system, in preferred embodiments of the measuring system, provision is made for the measured value from the overall system to be corrected by the contribution of the protective system, in order to permit accurate conclusions about the properties of the imaging system to be measured. To this end, an evaluation device of preferred embodiments contains an evaluation program for evaluating the superposition pattern and a correction program to take account by computation of the optical effect of the protective system on the structure of the superposition pattern.

The correction can be based on algebraic or beam optical calculations, the properties of the protective system being taken into account by means of its thickness, material or material combination and refractive index or refractive index combination in the transilluminated area. The contribution of the protective system to the measured result in other variants is determined experimentally by means of a comparative measurement with an unprotected but otherwise identical structure carrier.

The invention also relates to a structure carrier for a measuring system for the optical measurement of optical imaging systems, the structure carrier having at least one measuring structure. This can be, for example, a diffraction grating, a line structure for a Moiré measuring method or a measuring structure having at least one pinhole. In order to protect the measuring structure against an immersion liquid present at the point of use of the substrate carrier, the measuring structure is protected by a protective system in order to increase the resistance of the measuring structure to degradation caused by immersion liquid. The protective system can be formed, for example, by a thin single layer of quartz, which is preferably free of pores which go through from a free surface of the protective layer to the measuring structure to be protected.

This and further features also emerge from the description and the drawings, in addition to the claims, it being possible for the individual features in each case to be implemented on their own or in a plurality in the form of sub-combinations in an embodiment of the invention and in other fields and to represent embodiments which are advantageous and also intrinsically capable of protection. Exemplary embodiments of the invention are illustrated in the drawings and will be explained in more detail in the following text.

BRIEF DESCRIPTION OF THE DRAWINGS

FIG. 3 is a schematic side view of a measuring system for an immersion projection objective for measurement by means of point diffraction interferometry;

FIG. 4 is a schematic perspective view of an image-side measuring structure of the point diffraction interferometer from FIG. 3;

DETAILED DESCRIPTION OF THE PREFERRED EMBODIMENTS

Figure 1:
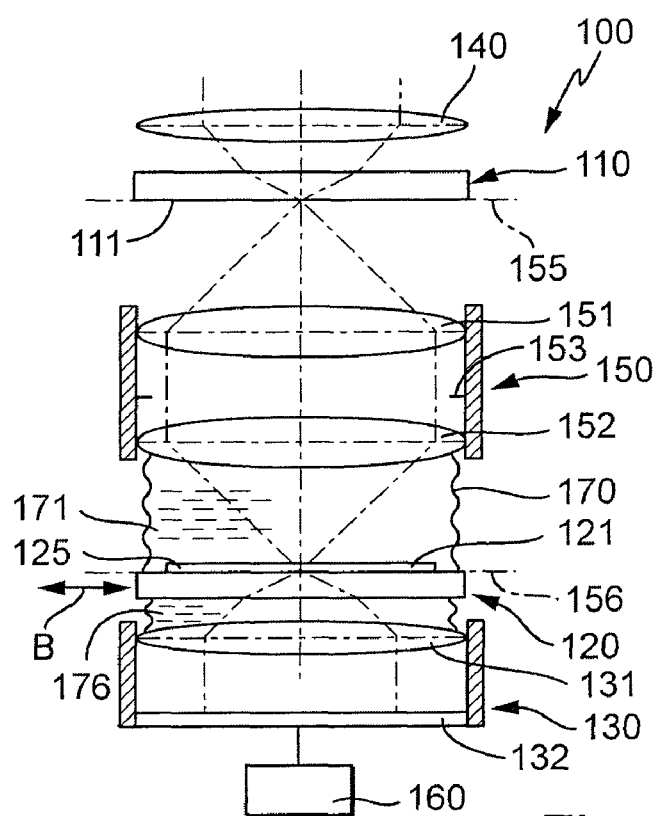
FIG. 1 is a schematic side view of an embodiment of a shearing interferometric measuring system for the optical measurement of an immersion projection objective which is integrated in a microlithography projection exposure system.

The measuring system 100 shown schematically in FIG. 1 is used for the optical measurement of a projection objective 150 which is incorporated into a microlithography projection exposure system, which is designed to produce finely structured semiconductor components by means of immersion lithography at an operating wavelength of 193 nm. The projection objective 150, which is built up from a multiplicity of lenses and acts as a reduction objective, is represented schematically by an entry-side lens 151 and an exit-side lens 152 and, during intended use, is used for the purpose of imaging a pattern of a structure-carrying mask (reticle) arranged in its object plane 155 into the image plane 156 of the projection objective, in which there is a light-sensitive layer which is applied to a semiconductor wafer to be structured. For this purpose, the reticle is illuminated with the aid of an illumination system 140 which, from the radiation of a laser serving as primary light source, forms illuminating radiation matched to the telecentric requirements of the projection objective.

For a change between production operation and measuring operation, the reticle, which, for example, bears a layout for a specific layer of a semiconductor component, is replaced by an object-side structure carrier 110 of the measuring system, to which an object-side measuring structure 111 is applied. As a replacement for a wafer, an image-side structure carrier 120 having an image-side measuring structure 121 is fitted in the region of the image plane 156. The latter is assigned a locally resolving detector 130, which is either changed in and out together with the image-side structure carrier 120 or can be installed permanently underneath the image plane.

On the object side of the imaging system 150 to be measured, the measuring system thus contains the illumination system 140 of the projection exposure system and the object-side structure carrier 110 with the object-side measuring structure 111, which is used as a coherence mask for the defined setting of the coherence of the measuring radiation entering the projection objective 150. For this purpose, the object-side measuring structure 111 is arranged in the object plane 155. The construction of suitable coherence masks is described, for example, in the patent application US 2002/0001088 A1, whose content is incorporated in this description by reference.

The image-side measuring structure 121 arranged on the image side of the imaging system 150, in the image plane of the latter, is designed as a diffraction grating and accordingly has grating structures of which the dimensions (for example line widths and line spacings) are of the order of magnitude of the wavelength of the measuring radiation. The image-side structure carrier with the diffraction grating 121 is, as indicated by a movement arrow B, arranged such that it can be moved laterally in the image plane of the projection objective 150.

The detector 130 following the diffraction grating in the radiation direction comprises a two-dimensionally extended, locally resolving light-sensitive detector element 132.

Arranged between the diffraction grating and the detector element is a microscope objective 131, which is mounted together with the detector element in an annular mount. The microscope objective 131 is designed to image the region of the pupil 153 of the projection objective onto the detector element 132, which is implemented, for example, as a CCD array of an image recording camera. The shearing interferometry interference patterns recorded by the detector element are evaluated in an evaluation unit 160 in order to determine imaging parameters which represent the imaging behaviour of the projection objective and/or its image defects or wave aberrations.

The function of such shearing interferometers is known to this extent and will therefore not be described in detail.

A special feature of the measuring system is that it is designed for the measurement of an immersion objective 150 in which, during the intended use in semiconductor production, a narrow interspace between the exit surface of the projection objective and the surface arranged in the image plane 121 of the resist layer applied to the wafer is filled with an immersion liquid which is highly refractive as compared with air or vacuum. In this way, the resolving power and the depth of focus can be increased with an unchanged vacuum operating wavelength.

In order to be able to carry out the measurement under the optical conditions which prevail during the intended use of the projection objective, the measuring system 100 is adapted to corresponding immersion operation. For this purpose, for the measurement a fluid chamber is formed between the objective exit and the image-side measuring structure 121 by means of a bellows 170 or other suitable means forming a fluid chamber, so that, during the measurement, an immersion liquid 171, which consists of extremely pure water in the exemplary case, can be arranged between the objective exit and the diffraction grating. Optionally, the interspace between the image-side structure carrier 120 and the detector 130 can also be filled with an immersion liquid 176, which is imperative for measurements with numerical apertures NA>1. In this case, bellows means or other means forming a fluid chamber can also be provided between the diffraction grating carrier 120 and the detector 130.

It should be pointed out that the manner in which the immersion liquid is put into the interspaces of interest and is kept there is not important to the invention. Given a suitable small axial extent of the interspaces, capillary forces can be sufficient to keep the immersion liquid in the interspace (cf. FIG. 2).

Figure 2:
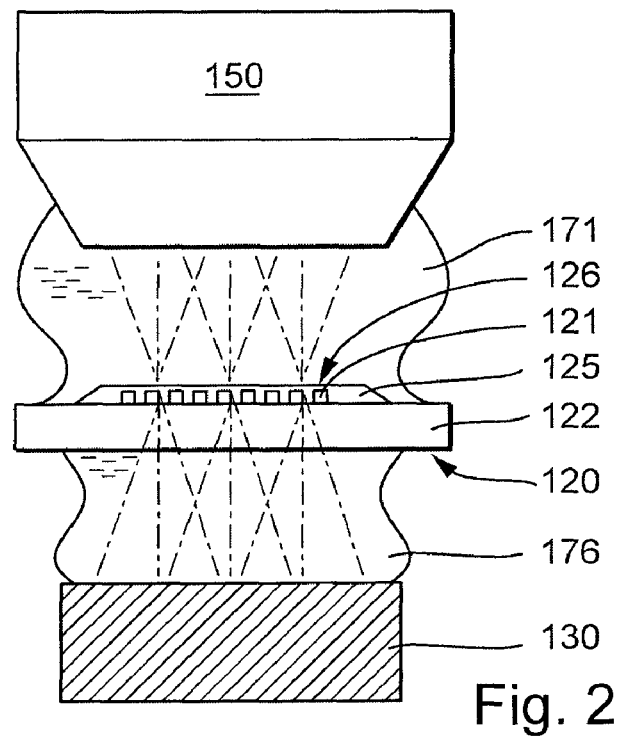
FIG. 2 is a detailed view of components arranged on the image side of the measuring system shown in FIG. 1 with an image-side measuring structure protected by a quartz protective layer.

In FIG. 2, the image-side part of the measuring system 100 is shown in detail. The image-side structure carrier 120 comprises a plane-parallel plate 122 made of a material which is transparent to the measuring radiation used and which, in the measuring system for 193 nm, is normally synthetic quartz glass and, in systems for 157 nm, is usually calcium fluoride. The diffraction grating 121 is formed by a microstructured coating of chromium, which is applied to the flat substrate surface to be pointed towards the projection objective. Examples of possible structures for diffraction gratings, for example checkerboard-like diffraction gratings, are shown in US 2002/0001088 A1.

There is the risk that the chromium layer forming the diffraction grating 121 will be damaged under the action of the short-wave measuring radiation in the event of relatively long-lasting contact with the immersion liquid, so that, for example, the line widths and/or line spacings can change gradually as a result of dissolution or separation of chromium and/or as a result of deposition of reaction products between the immersion liquid and chromium. In order to avoid these degradation phenomena, which are damaging to the measuring accuracy, the diffraction grating 123 is protected against attack by the immersion medium by a protective system 125. The protective system 125 is formed by a single protective layer of quartz ($SiO_2$), which, in a thin layer process following the structuring of the coating 121 forming the structure, is applied to the coating by vapour deposition or the like in such a way that the protective layer covers the diffraction grating coating in a protective manner both on the side facing away from the substrate and at the lateral edges. The sensitive image-side measuring structure 121 is thus surrounded on all sides by protective quartz and is therefore encapsulated.

By means of suitable process management during the ion-assisted production of the quartz layer 125, the latter is substantially pore-free or free of pores which go through from the outside facing the immersion liquid as far as the protective metal coating 121. Since the transparent quartz material of the protective layer is also chemically resistant to water, permanent protection of the sensitive measuring structure 121 by a barrier layer 125 which is insoluble in liquid and liquid-tight is ensured.

It has been shown that a quartz coating with a single layer of suitable thickness (for example between 30 nm and 100 nm) fulfils the boundary conditions necessary for its purpose as a protective layer. These include radiation stability, adequate transparency to the measuring radiation used, chemical stability with respect to the immersion liquid and substances which may be dissolved therein and/or chemical stability with respect to reaction products of the immersion liquid generated by radiation and/or the substances dissolved therein. Furthermore, the sealing property which is critical for the effectiveness of the protective layer is provided, as is chemical stability with respect to the chromium material of the diffraction grating and the (chemically identical) substrate. Other suitable layer systems are shown in the provisional U.S. application U.S. 60/530,623, filing date 19 Dec. 2003, of the applicant, the contents of which are hereby incorporated in this description by reference.

In the evaluation of the interferograms, in this embodiment account is taken of the fact that the protective layer 125 has an optical effect, which is superimposed on the optical properties of the imaging system which are actually sought. To a first approximation, in this case the protective layer is taken into account as a plane-parallel plate over the diffraction grating, which provides a spherically symmetrical contribution to the wave front of the imaging system. The evaluation program integrated into the evaluation unit contains a correction program for taking account of this effect, which corresponds to an introduction of spherical aberration. To this end, on the basis of known relationships relating to the action of plane plates (cf., for example, the textbook by Schröder "Technische Optik" [Technical Optics], Vogel Buchverlag, 8th edition, (1998)), by using the optical properties of the protective layer, such as thickness and refractive index, the contribution of the protective layer to the measured result is determined by means of algebraic or beam optical calculation and a resulting correction value is taken into account in a computational correction.

Figure 8:
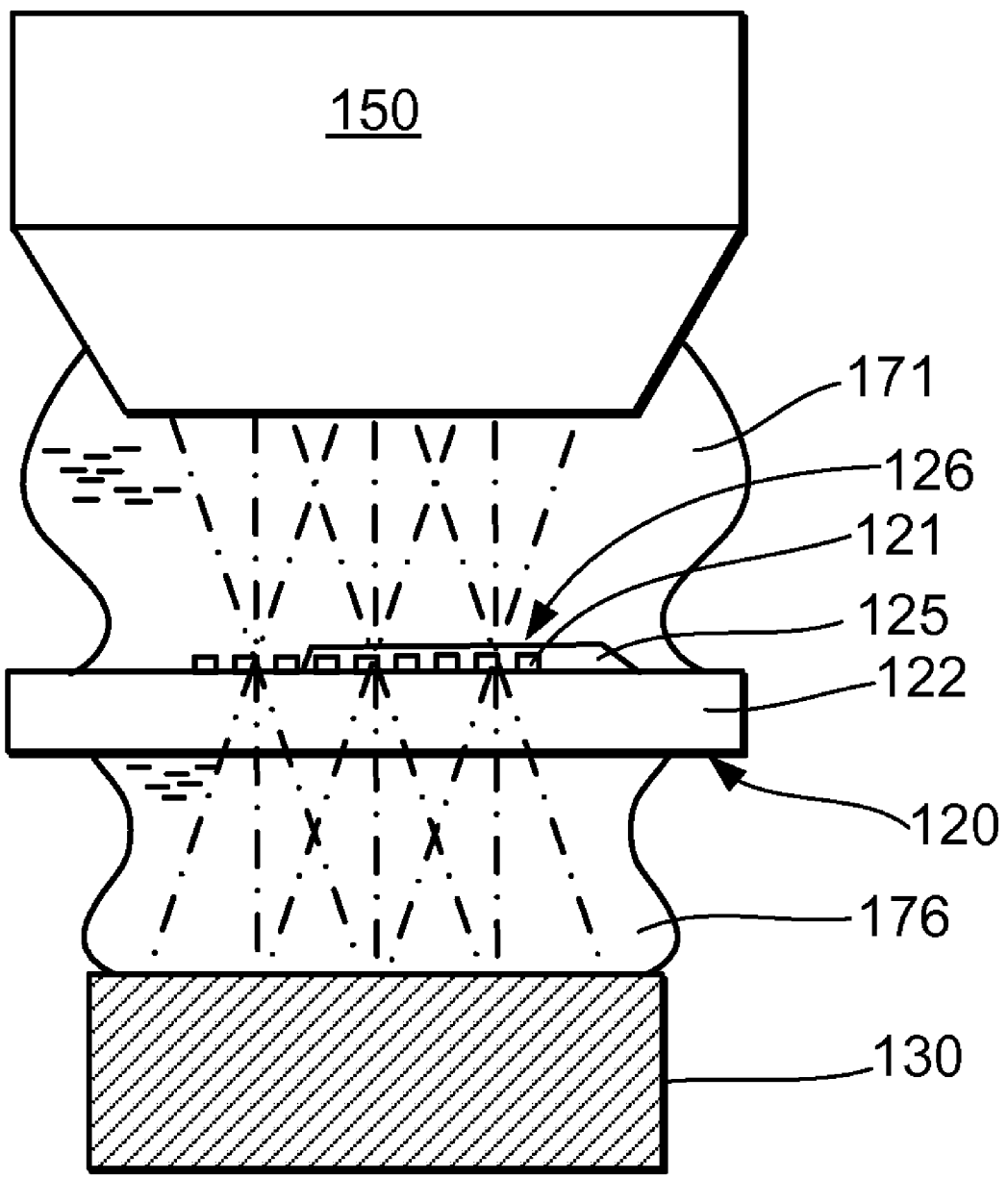
FIG. 8 is a detailed view of components arranged on the image side of the measuring system shown in FIG. 1 with an image-side measuring structure having only a subregion protected by a protective layer.

In another correction method, an experimental calibration of the measuring system is carried out. For this purpose, by means of a comparative measurement of a diffraction grating provided with a protective layer and an uncoated but otherwise identical diffraction grating, the contribution of the protective layer to the measured result is determined experimentally. This contribution is then taken into account during the evaluation of the interferogram. The comparative measurement can be carried out on different structure carriers. It is also possible for the structures to be compared to be located on the same structure carrier. The uncoated comparative structure can be formed, for example, by a portion of the same substrate carrier which is uncoated or freed of the protective layer. This is shown in FIG. 8, where the diffraction grating 122 is provided with the protective system 125 only in a subregion of the diffraction grating 122. In this way, an in-situ comparative measurement is possible, the result of which is linked dynamically with the optical conditions present during the measurement.

The influence to be corrected of the protective layer on the measured result is lower, the lower the difference in the refractive index between the protective layer and the immersion liquid. For the immersion liquid extremely pure water, which has a refractive index of about 1.437 at 193 nm, this can be achieved by use being made of a protective layer material having a lower (average) refractive index as compared with quartz (n≈1.56). For instance, protective layers with low refractive index fluoride materials, for example the above-mentioned rare earth fluoride materials, can be used.

It should also be noted that the quartz coating is also advantageous with regard to the fact that, in 193 nm immersion lithography, attempts have recently been made to increase the refractive index of the water used by means of additives that increase the refractive index. For example, by means of additions of sulfates, alkalis, such as caesium, or phosphates to water, ionized liquids were able to be produced of which the refractive index is higher than that of extremely pure water (cf. Internet publication under the title "'Doped water' could extend 193-nm immersion litho" by D. Lammers, http://www.eetimes.com/semi/news/jan.2004). In this way, the difference in refractive index in relation to the quartz layer can be reduced to such an extent that it may be possible for the above-mentioned correction to become dispensable.

At an operating wavelength of 157 nm, for example perfluoropolyether (PFPE) is suitable, which is sufficiently transparent at 157 nm and compatible with some photoresist materials used at present in microlithography. One immersion liquid tested has a refractive index of $n_f$=1.37 at 157 nm. Suitable materials for a liquid-resistant protective layer are, for example, the above-mentioned rare earth fluorides which are transparent at 157 nm.

Structure carriers having measuring structures protected according to the invention are also useful for measuring systems operating in accordance with other measuring principles. For instance, the object-side measuring structure and the image-side measuring structure can be matched to each other such that when the object-side measuring structure is imaged onto the image-side measuring structure, a Moiré pattern is produced, as mentioned at the beginning. One difference from the diffraction grating structure of the measuring system according to FIG. 1 in the case of Moiré systems is that the physical coherence property of the object-side measuring structure is selected such that diffraction effects do not play any relevant part in the measurement.

In FIG. 3, an embodiment of a measuring system 300 is shown which is constructed as a point diffraction interferometer for immersion operation. Identical or corresponding features bear the same reference symbols as in FIG. 1, increased by 200.

On the object side of the imaging system 350, following the illumination system 340, is an object-side structure carrier 310, which comprises an object-side measuring structure 311 with a pinhole 312, which is arranged in the object plane 355 in order to generate a first spherical wave. Provided between the pinhole mask 310 and the entry-side lens 351 of the projection objective is a beam splitter in the form of a diffraction grating 315, in order to generate a second spherical wave coherent with the first wave. Alternatively, the beam-splitting diffraction grating can be arranged in front of the object-side pinhole measuring structure or on the image side between objective exit and an image-side measuring structure, likewise formed as a pinhole measuring structure. For the purpose of phase shifting, the beam-splitting diffraction grating 315 is arranged such that it can be moved laterally, as symbolized by the movement arrow B.

The image-side measuring structure 321 positioned in the image plane 356 or in the vicinity of the image plane of the projection objective (cf. FIG. 4) has a second pinhole 322, in order to generate a spherical reference wave by diffraction. The radiation for the generation of the reference wave originates from the imaging of the first or second spherical wave supplied by the diffraction grating 315 through the imaging system, which are represented schematically in FIG. 3 by continuous and dashed lines, respectively. In addition to the pinhole 322, the image-side measuring structure has a second, larger opening 323 to allow the specimen wave to pass through freely. In this way, coherent superposition of reference and specimen waves occurs on the detection plane of the detector element 332, and the interference pattern that is produced can be detected in a locally resolved manner by the detector element 332 and evaluated by an evaluation unit 360 connected downstream.

Here, too, the projection objective 350 is an immersion objective, so that the measurement is advantageously carried out with the aid of an immersion liquid 371 arranged between projection objective and image-side measuring structure 321, it being possible for immersion liquid 376 to be provided between the image-side structure carrier 320 and the detector as well.

As can be seen from FIG. 4, the image-side structure is formed by a chromium coating 321 applied to a quartz substrate 325, in which the pinhole 322 having a diameter comparable with the operating wavelength and the second opening 323, which is substantially larger by comparison, are provided as cutouts. A closed quartz protective layer 325 with a thickness of about 30 nm to 100 nm covers the entire opaque region formed by the chromium coating with a lateral overlap, in exactly the same way as the transparent regions of pinhole 322 and reference opening 323.

As in the embodiment according to FIGS. 1 and 2, the optical effect of the quartz coating 325 can also be taken into account here in the evaluation of the point diffraction interferogram for the correction of the measured result.

Figure 5:
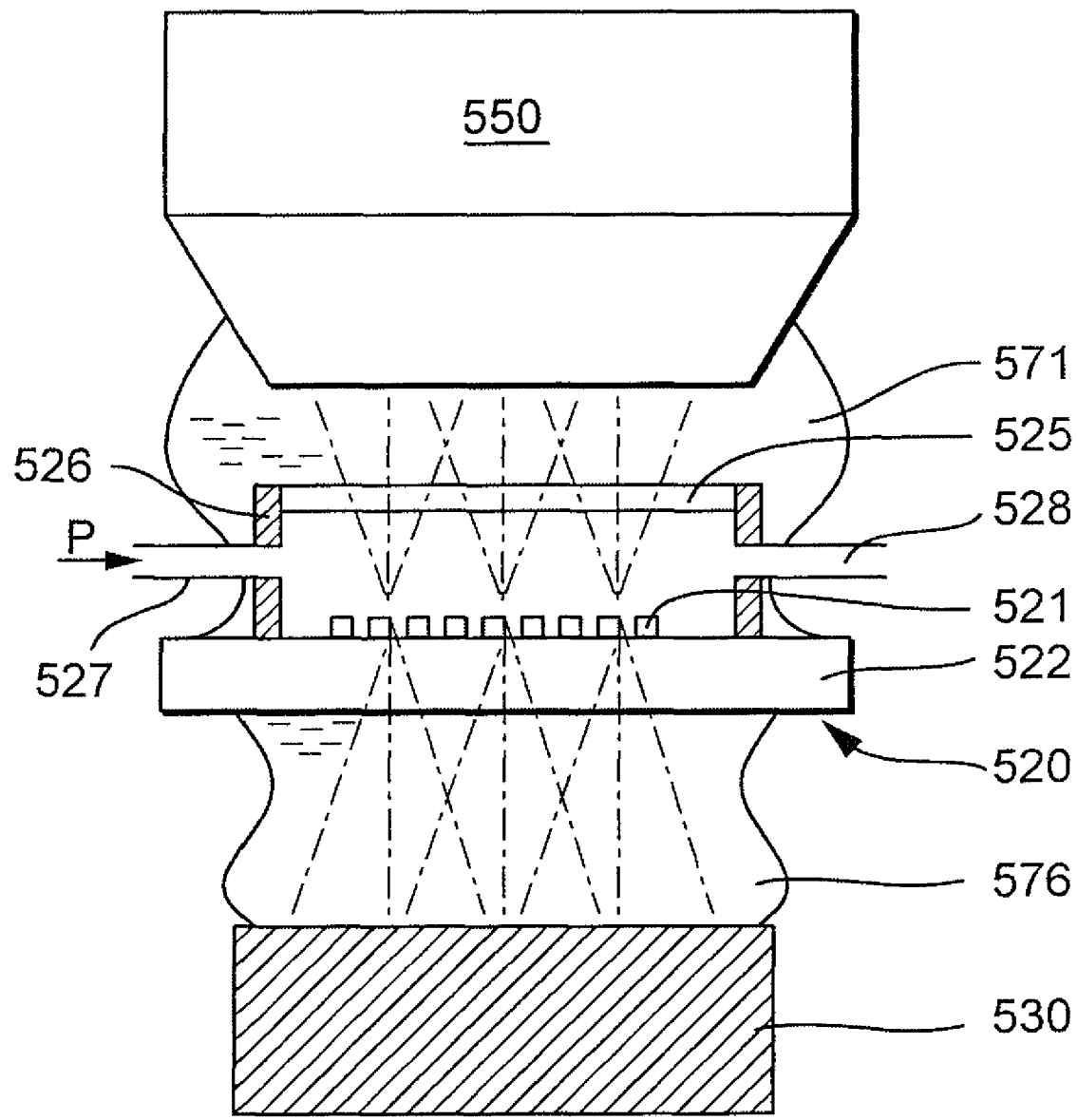
FIG. 5 is a detailed view of components arranged on the image side of another embodiment of a measuring system having an image-side measuring structure protected by a plane plate made of quartz glass.

FIG. 5 shows a detailed view of components arranged on the image side of a projection objective of another embodiment of a measuring system for shearing interferometry adapted to immersion operation. Identical or corresponding features bear the same reference symbols as in FIG. 2, increased by 400.

In this embodiment, the image-side measuring structure 521 to be protected against the immersion liquid 571, as in many conventional measuring structures, is not provided with a thin optical coating but is uncoated. The protection against the immersion liquid is produced by the fact that the measuring structure 521 is covered by a plane-parallel, transparent plate 525, which is kept a small distance above the diffraction grating 521 by a holding structure 526 to be placed annularly around the diffraction grating 521. The height of the liquid-tight and liquid-resistant holding ring 526 is dimensioned such that a hollow space is produced between the self-supporting plate 525 and the measuring structure. The plane plate consists of a material which both allows through the radiation at the operating wavelength of the system and, under irradiation, is sufficiently chemically stable with respect to the immersion liquid used and substances or reaction products which may possibly be dissolved therein. In the 193 nm system shown, the plate 525 consists of a synthetic quartz glass, in the case of 157 nm systems, calcium fluoride can be used as the plate material. The plate can be provided with a thin optical layer on one or both of its flat plate surfaces in order to reduce reflection. Together with the holding structure 526, the plate forms a protective system which surrounds the measuring structure in a liquid-tight manner.

The hollow space formed between plate 525 and measuring structure 521 can be filled with a gas or with a second immersion liquid, depending on the measuring conditions. In the case of a filling with a second immersion liquid, this should preferably be chosen such that it does not attack the material of the chromium coating forming the structure 521 under irradiation at the operating wavelength, and has a lower refractive index than the plane plate. In this case, there is the possibility, by selecting a suitable distance between the plane plate and the measuring structure, of compensating for the optical effect of the plane plate on the imaging beam path in a mechanical-optical way. In this case, the height of the hollow space is preferably selected such that the spherical aberration introduced by the plane plate 525 is largely or completely compensated for by the substantially plane-parallel layer of the transparent liquid of low refractive index. Alternatively, in the case of a given hollow space, the thickness of the plane plate 525 can also be matched to the height of the hollow space by means of suitable remachining steps. In these cases, the aforementioned correction of the measured results can be dispensed with. A further advantage when a second immersion liquid is used is that, irrespective of the first immersion liquid 571 used for the imaging system, it is possible to select a liquid which does not attack the measuring structure on the substrate 522, even under irradiation, or not to the same extent as the first immersion liquid 571.

If the hollow space is filled with a gas, the compensating property of the hollow space can be satisfied well, since gases have a lower refractive index than transparent solid bodies. In the case of filling with a gas, provision can be made to keep this at a controllable positive pressure, so that possible deflection of the plane plate 525 under the action of the first immersion liquid 571 can be avoided. To this end, a pressurized gas connection 527 can be provided on the holding ring 526. When a second immersion liquid is used within the hollow space, the connection can also be used for filling the hollow space with this liquid. In a development of this device, the second immersion liquid can be drawn off through a second connection 528, so that a liquid circuit is created. This has the advantage that contamination, for example induced by radiation, could be reduced on account of the flushing effect.

The determination of the distance between the plane plate 525 serving as the transparent part of the protective system and the measuring structure 521 to be protected, for the purpose of the refractive index compensation described, can be done in particular in the following two ways. Firstly, in a computational way, if the thickness and the refractive index of the plane plate and the refractive index of the second immersion liquid or of the gas at the operating wavelength are known sufficiently accurately. Alternatively or additionally, comparative measurements with an image-side substrate carrier 520 not modified in the above-described way but otherwise structurally identical can be carried out, by using a device which permits continuous adjustment of the axial spacing between the image-side measuring structure 521 and the plane plate 525. This setting is preferably carried out by being changed step by step until the measured results from the measurement with the protective system no longer differ substantially from those from a measurement without protective system and with the same test objective.

In order to minimize the optical effect of a protective coating on the measuring structure, in a development of the invention provision is made to remachine the protective layer by means of a machining step in which possible shape deviations on account of the underlying structure layer are corrected. For example, such a machining step can be a polishing process, with which a highly accurate plane surface is produced on the outer side of the protective layer and is used as a radiation entry surface. If the outer side of the coating is already flat because of the coating process, it is possible to dispense with such a machining step. In the embodiment shown in FIG. 2, the protective layer 125 has an optically flat outer surface 126, although the layer thickness of the protective layer 125 between the opaque regions with metal layer 121 and the transparent regions without metal layer 121 lying between them varies sharply.

As an alternative to the protective coating described, which seals the substrate and the coating forming the measuring structure completely with an optically transparent layer material, it is also possible to provide only the metallic components of the structure layer forming the measuring structure with a suitable protective system. One advantage of this method is that there is no beam optical change in the light path for the incident radiation but, in any case (depending on the typical structure size of the measuring structure), there is a slight structural change in the diffraction property, so that a considerably lower optical effect of the protective system can be expected.

Figure 6:
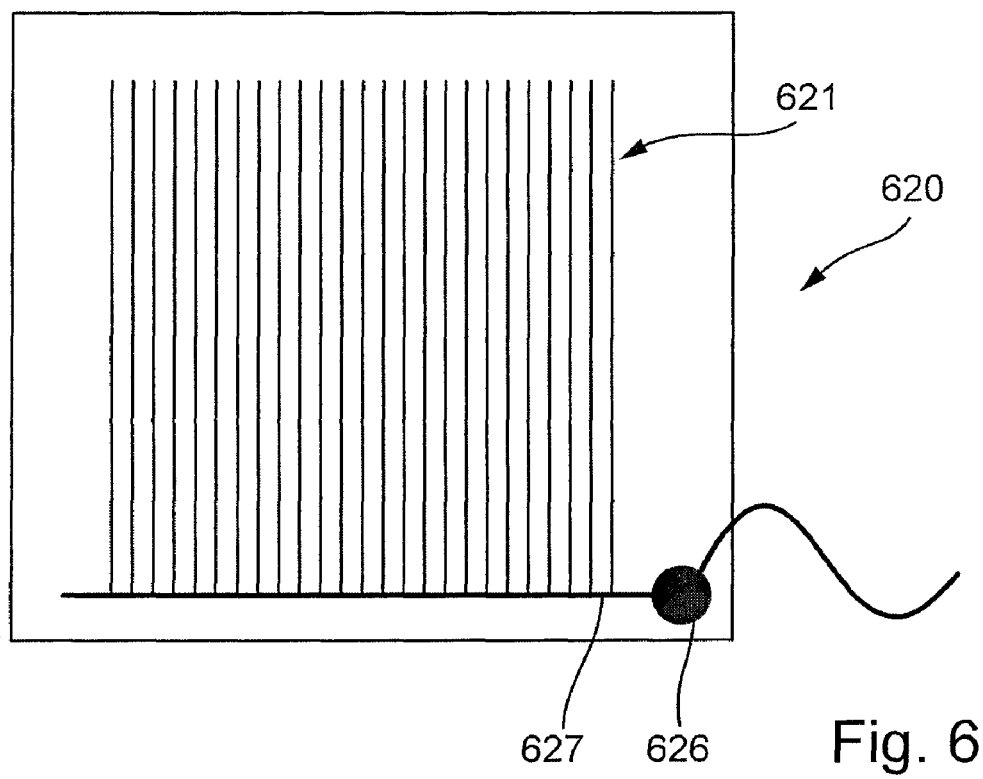
FIG. 6 is a schematic illustration of a line grating which is protected by a protective layer produced by electroplating.
Figure 7:
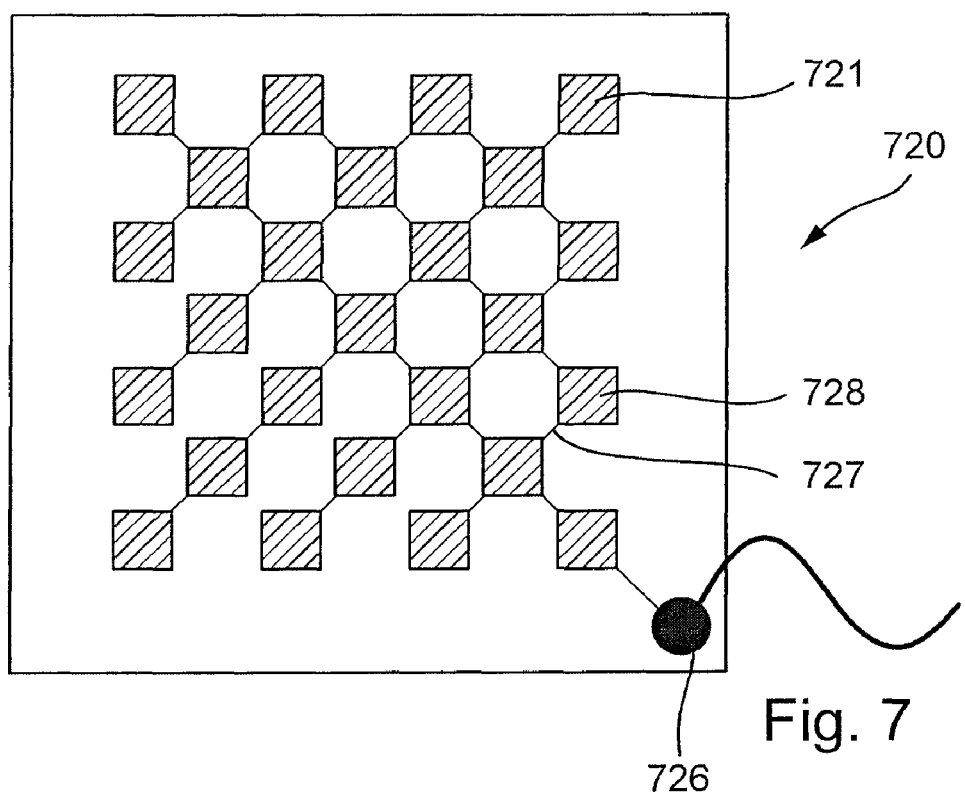
FIG. 7 is a schematic illustration of a checkerboard diffraction grating which is protected by a protective layer produced by electroplating.

In one development, an electroplated coating of the metallic coating (for example of the chromium) forming the measuring structure with another metal, for example gold, which is chemically more stable with respect to the immersion liquid is provided. Because of the electrochemical application, this selectively applied protective layer adheres only to the electrically conductive material of the coating (for example chromium) forming the measuring structure but not to the electrically non-conducting substrate material (for example glass). A precondition for an electroplated coating is that the structures to be protected must be capable of making electrically conductive contact, for example by being connected to one another. In the case of a line grating (FIG. 6), this can be done by incorporating a connecting structure 627 connected to an electrical contact 626 in the grating design. In a checkerboard-like structure (FIG. 7) which is suitable in particular for shearing interferometry, the electrical connection to the individual chromium fields 728 can be ensured by incorporating small connecting lands 727 into the design, one of which leads to an electrical contact.

In another embodiment, the metallic layer of material of the coating forming the measuring structure is subjected to a chemical treatment, so that a connection which is chemically more stable with respect to the immersion liquid than the metal itself is produced on the surface of the coating. Passivation of this type is known for aluminum, for example. Under specific conditions in conjunction with atmospheric oxygen, aluminum forms what is known as a passivation layer of aluminum oxide at the surface, which makes it inert with respect to further reactions with water or oxygen. A protective layer can thus also be formed by a passivation layer which is produced by chemical reaction of the coating material forming the measuring structure with a suitable surrounding medium. This protective layer then contains the coating material itself as a constituent component.

The invention is not restricted to the protection of structure carriers to be fitted on the image side. In addition, the measuring structures of structure carriers to be fitted on the object side can be protected in accordance with the invention, for example the coherence mask 110 shown in FIG. 1, the pinhole mask 310 shown in FIG. 3 and the diffraction grating 315 or a Moiré mask. This applies in particular to the case in which, in the imaging system measured, an immersion liquid is used on the object side during useful operation, for example in the region of the reticle of a microlithography system.

The invention claimed is:

1. A measuring system for optically measuring a microlithography optical imaging system configured to image a pattern arranged in an object surface of the imaging system onto an image surface of the imaging system, the measuring system comprising:
   an object-side structure carrier comprising an object-side measuring structure arranged on an object side of the imaging system;
   an image-side structure carrier comprising an image-side measuring structure arranged on an image side of the imaging system;
   the object-side measuring structure and the image-side measuring structure matched to each other to produce a superposition pattern when the object-side measuring structure is imaged onto the image-side measuring structure by the imaging system; and
   a detector detecting the superposition pattern in a locally resolving manner; wherein: the imaging system is an immersion system configured to image the pattern onto the image surface with an immersion liquid; at least one of the object-side structure carrier and the image-side structure carrier is arranged in a region of the immersion liquid; and
   a protective system is provided for the structure carrier arranged in the region of the immersion liquid, the protective system increasing a resistance of the measuring structure of the structure carrier arranged in the region of the immersion liquid to degradation by the immersion liquid.

2. The measuring system as claimed in claim 1, wherein at least one of the structure carriers comprises a substrate on which a coating forming the measuring structure is applied to at least one substrate surface.

3. The measuring system as claimed in claim 2, wherein the coating consists of a metal or a metal alloy.

4. The measuring system as claimed in claim 2, wherein the coating consists of chromium or a chromium-containing metal.

5. The measuring system as claimed in claim 1, wherein the protective system is applied in relation to a coating forming the measuring structure and the substrate such that the coating is enclosed by the substrate and the protective system to be at least substantially liquid-tight on all sides.

6. The measuring system as claimed in claim 1, wherein the protective system comprises at least one protective layer that is transparent to measuring radiation.

7. The measuring system as claimed in claim 6, wherein the protective layer is formed by a single material layer that is transparent to the measuring radiation.

8. The measuring system as claimed in claim 6, wherein the protective layer comprises at least one barrier layer that is at least substantially impermeable to the immersion liquid.

9. The measuring system as claimed in claim 8, wherein the barrier layer consists of at least one barrier layer material that is at least substantially chemically resistant to the immersion liquid and is at least substantially free from pores which extend from an outer side of the barrier layer, facing away from the measuring structure, to a side of the barrier layer facing the measuring structure.

10. The measuring system as claimed in claim 6, wherein the protective layer is a single layer of silicon dioxide.

11. The measuring system as claimed in claim 10, wherein the single layer of silicon dioxide has a geometric layer thickness between 30 nm and 100 nm.

12. The measuring system as claimed in claim 6, wherein the protective layer comprises a plurality of material layers lying one above another.

13. The measuring system as claimed in claim 6, wherein the protective layer is a reflection-reducing layer for a solid-liquid interface formed between the protective layer and the immersion liquid.

14. The measuring system as claimed in claim 6, wherein the protective layer is an electroplated coating of a metallic coating forming the measuring structure and is made of a metal which is chemically more stable with respect to the immersion liquid than the material of the metallic coating.

15. The measuring system as claimed in claim 6, wherein the protective layer is a passivation layer from a reaction product of material of a metallic coating forming the measuring structure, which is chemically more stable with respect to the immersion liquid than the material of the metallic coating.

16. The measuring system as claimed in claim 6, wherein the protective layer is corrected with respect to shape deviations on account of an underlying coating forming the measuring structure such that an outer side of the protective layer, serving as a radiation entry surface, is a planar surface.

17. The measuring system as claimed in claim 1, wherein the protective system is formed exclusively by a protective layer applied to the measuring structure.

18. The measuring system as claimed in claim 1, wherein the protective system is a component that is separate from the structure carrier arranged in the region of the immersion liquid and which is fitted between the measuring structure and the immersion liquid.

19. The measuring system as claimed in claim 1, further comprising an interspace between the measuring structure and the protective system.

20. The measuring system as claimed in claim 19, wherein the interspace is filled with a gas or a liquid.

21. The measuring system as claimed in claim 1, wherein the protective system comprises a plane-parallel plate that is transparent to measuring radiation and which, at least during a measurement, is arranged between the measuring structure and the immersion liquid.

22. The measuring system as claimed in claim 21, wherein the protective system further comprises a holding structure for the plate which, when placed on the structure carrier arranged in the region of the immersion liquid, laterally encloses the measuring structure, so that the measuring structure is enclosed in a liquid-tight manner by the protective system formed by the plate and the holding structure.

23. The measuring system as claimed in claim 1, wherein the immersion liquid is arranged between a last image-side optical element and the image surface of the imaging system, and the image-side structure carrier is arranged in the region of the immersion liquid such that the image-side measuring structure is arranged in or near the image surface of the imaging system.

24. The measuring system as claimed in claim 1, wherein the measuring system is a diffraction interferometer configured for immersion operation, wherein the image-side measuring structure has a first opening dimensioned to generate a reference wave and a second opening, which is larger than the first opening, dimensioned to allow a specimen wave emerging from the imaging system to pass through freely, such that the superposition pattern is an interference pattern formed by a coherent superposition of the reference wave and the specimen wave.

25. The measuring system as claimed in claim 24, wherein the immersion liquid is arranged between a last image-side optical element and the image surface of the imaging system, and the image-side structure carrier is arranged in the region of the immersion liquid such that the image-side measuring structure is arranged in or near the image surface of the imaging system.

26. The measuring system as claimed in claim 1, wherein the measuring system is configured to operate at an operating wavelength in the deep ultraviolet range.

27. The measuring system as claimed in claim 26, wherein the operating wavelength is at least approximately 193 nm.

28. An optical measurement device for measuring a microlithography imaging system, comprising:
- a first structure carrier at least substantially transparent to measuring radiation in a predefined wavelength range; and
- a second structure carrier at least substantially transparent to the radiation and separated from the first structure carrier by a space sufficient to accommodate a microlithography projection objective to be measured and an immersion liquid to be interposed between the microlithography projection objective and the second structure carrier;
- wherein the second structure carrier comprises a diffraction grating and a protective arrangement shielding the diffraction grating entirely from the space; and
- wherein the protective arrangement is at least substantially chemically resistant to and impervious to the immersion liquid.

29. The optical measurement device according to claim 28, wherein the diffraction grating consists at least essentially of chromium and the protective arrangement comprises a coating consisting at least essentially of quartz.

30. The optical measurement device according to claim 28, wherein the diffraction grating consists at least essentially of chromium and the protective arrangement comprises a coating consisting at least essentially of gold.

31. The optical measurement device according to claim 28, wherein the diffraction grating consists at least essentially of aluminum and the protective arrangement comprises a passivation layer of at least essentially aluminum oxide.

32. The optical measurement device according to claim 28, wherein the protective arrangement comprises a plate spatially removed from the diffraction grating and consisting at least essentially of synthetic quartz glass or calcium fluoride.

33. A measuring system for optically measuring a microlithography optical imaging system configured to image a pattern arranged in an object surface of the imaging system onto an image surface of the imaging system, the measuring system comprising:
- an object-side structure carrier comprising an object-side measuring structure arranged on an object side of the imaging system;
- an image-side structure carrier comprising an image-side measuring structure arranged on an image side of the imaging system;
- the object-side measuring structure and the image-side measuring structure matched to each other to produce a superposition pattern when the object-side measuring structure is imaged onto the image-side measuring structure by the imaging system; and
- a detector detecting the superposition pattern in a locally resolving manner;

wherein:
- the imaging system is an immersion system configured to image the pattern onto the image surface with an immersion liquid;
- at least one of the object-side structure carrier and the image-side structure carrier is arranged in a region of the immersion liquid; and
- a protective system is provided for the structure carrier arranged in the region of the immersion liquid, the protective system increasing a resistance of the measuring structure of the structure carrier arranged in the region of the immersion liquid to degradation by the immersion liquid; and
- further comprising an evaluation device outputting a signal representing at least one imaging parameter describing an imaging quality of the imaging system from the superposition pattern, the evaluation device comprising an evaluation program evaluating the superposition pattern and a correction program computationally correcting an optical effect of the protective system on the superposition pattern, wherein the computational correction of the optical effect of the protective system is calculated from a difference between a first value of at least one measured variable of the measuring structure with the protective system and a second value of the measured variable of the identical measuring structure without the protective system.

34. The measuring system as claimed in claim 33, wherein the measuring structure with the protective system and the measuring structure without the protective system are formed by a measuring structure provided with a protective system only in a subregion.

* * * * *

UNITED STATES PATENT AND TRADEMARK OFFICE
CERTIFICATE OF CORRECTION

PATENT NO. : 7,796,274 B2  Page 1 of 1
APPLICATION NO. : 11/628061
DATED : September 14, 2010
INVENTOR(S) : Markus Mengel et al.

It is certified that error appears in the above-identified patent and that said Letters Patent is hereby corrected as shown below:

Title page, Item (75), Inventors, line 6, delete "Mathussen" insert --Mathijssen--.

Column 1, line 20, after "system" insert --.--.

Column 3, line 34, delete "$n_1 = 1.437$" insert --$n_1 \approx 1.437$--.

Column 10, line 35, after "application" delete --U.S.--.

Column 11, line 29, delete ""Doped water"" insert --'Doped water'--.

Signed and Sealed this

Fourteenth Day of December, 2010

David J. Kappos
*Director of the United States Patent and Trademark Office*